US009085458B2

(12) United States Patent
Bao et al.

(10) Patent No.: US 9,085,458 B2
(45) Date of Patent: Jul. 21, 2015

(54) SELECTIVE NANOTUBE FORMATION AND RELATED DEVICES

(75) Inventors: Zhenan Bao, Stanford, CA (US); Melburne Lemieux, Lahonda, CA (US); Justin P. Opatkiewicz, Stanford, CA (US); Soumendra N. Barman, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 296 days.

(21) Appl. No.: 13/526,780

(22) Filed: Jun. 19, 2012

(65) Prior Publication Data

US 2012/0258569 A1 Oct. 11, 2012

Related U.S. Application Data

(62) Division of application No. 12/492,829, filed on Jun. 26, 2009, now Pat. No. 8,237,155.

(60) Provisional application No. 61/133,789, filed on Jul. 2, 2008.

(51) Int. Cl.
*B05D 3/12* (2006.01)
*B82B 3/00* (2006.01)
*B82Y 10/00* (2011.01)
*B82Y 30/00* (2011.01)
*B82Y 40/00* (2011.01)
*H01L 21/02* (2006.01)
(Continued)

(52) U.S. Cl.
CPC . *B82B 3/00* (2013.01); *B82Y 10/00* (2013.01); *B82Y 30/00* (2013.01); *B82Y 40/00* (2013.01); *H01L 29/0673* (2013.01); *H01L 21/02606* (2013.01); *H01L 21/02628* (2013.01); *H01L 21/02658* (2013.01); *H01L 21/02664* (2013.01); *H01L 29/0665* (2013.01); *H01L 51/0048* (2013.01); *Y10S 977/762* (2013.01); *Y10S 977/882* (2013.01)

(58) Field of Classification Search
CPC .................................................. H01L 21/02628
USPC ....................... 257/40, 48, 288; 977/762, 882
See application file for complete search history.

(56) References Cited

U.S. PATENT DOCUMENTS

2003/0098488 A1 5/2003 O'Keeffe et al.
2005/0067349 A1* 3/2005 Crespi et al. .................. 210/634
(Continued)

OTHER PUBLICATIONS

J. Hu; T. Wang Odom and C. Lieber, "Chemistry and Physics in One Dimension: Synthesis and Properties of Nanowires and Nanotubes," Acc. Chem. Res., vol. 32, No. 5, pp. 435-445, (1999).

(Continued)

*Primary Examiner* — Alexander Weddle
(74) *Attorney, Agent, or Firm* — Crawford Maunu PLLC (57) ABSTRACT

Nanotube electronic devices exhibit selective affinity to disparate nanotube types. According to an example embodiment, a semiconductor device exhibits a treated substrate that selectively interacts (e.g., chemically) with nanotubes of a first type, relative to nanotubes of a second type, the respective types including semiconducting-type and metallic-type nanotubes. The selective interaction is used to set device configuration characteristics based upon the nanotube type. This selective-interaction approach can be used to set the type, and/or characteristics of nanotubes in the device.

19 Claims, 5 Drawing Sheets

(51) Int. Cl.
  *H01L 29/06* (2006.01)
  *H01L 51/00* (2006.01)

(56) References Cited

U.S. PATENT DOCUMENTS

2005/0106846 A1  5/2005  Dubin
2005/0181143 A1* 8/2005  Zhang et al. .................. 427/532
2009/0309091 A1  12/2009 Ishida

OTHER PUBLICATIONS

J. Liu; M. Casavant; M. Cox; D. Walters; P. Boul; W. Lu; A. Rimberg; K. Smith; D. Colbert and R. Smalley, "Controlled Deposition of Individual Single-Walled Carbon Nanotubes on Chemically Functionalized Templates," Chem. Phy. Lett., vol. 303, pp. 125-129, (1999).

P. Collins; M. Arnold and P. Avouris, "Engineering Carbon Nanotubes and Nanotube Circuits Using Electrical Breakdown," Science, vol. 292, pp. 706-709, (2001).

A. Jorio; R. Saito; J. Hafner; C. Lieber; M. Hunter; T. McClure; G. Dresselhaus and M.S. Dresselhaus, "Structural (n, m) Determination of Isolated Single-Wall Carbon Nanotubes by Resonant Raman Scattering," Phys. Rev. Lett., vol. 86, No. 6, pp. 1118-1121, (2001).

R. Baughman; A Zakhidov and W. de Heer, "Carbon Nanotubes—the Route Toward Applications," Science, vol. 297, pp. 787-792, (2002).

M.S. Dresselhaus; G. Dresselhaus; A. Jorio; A. Souza Filho and R. Saito, "Raman Spectroscopy on Isolated Single Wall Carbon Nanotubes," Carbon, vol. 40, pp. 2043-2061, (2002).

R. Krupke; F. Hennrich; H. Löhneysen and M. Kappes, "Separation of Metallic from Semiconducting Single-Walled Carbon Nanotubes," Science, vol. 301, pp. 344-347, (2003).

S. Rao; L. Huang; W. Setyawan and S. Hong, "Large-Scale Assembly of Carbon Nanotubes," Nature, vol. 425, pp. 36-37, (2003).

E. Snow; J. Novak; P. Campbell and D. Park, "Random Networks of Carbon Nanotubes as an Electronic Material," Appl. Phys. Lett., vol. 82, No. 13, pp. 2145-2147, (2003).

V. Tsukruk; H. Ko and S. Peleshanko, "Nanotube Surface Arrays: Weaving, Bending, and Assembling on Patterned Silicon," Phys. Rev. Letter., vol. 92, No. 6, pp. 065502-1-065502-4, (2004).

R. Duggal; F. Hussain and M. Pasquali, "Self-Assembly of Single-Walled Carbon Nanotubes into a Sheet by Drop Drying," Adv. Mater., vol. 18, pp. 29-34, (2006).

J. Ahn; H. Kim; K. Lee; S. Jeon; S. Kang; Y. Sun; R. Nuzzo and J. Rogers, "Heterogeneous Three-Dimensional Electronics by Use of Printed Semiconductor Nanomaterials," Science, vol. 314, pp. 1754-1757, (2006).

E. Snow; F. Perkins and J. Robinson, "Chemical Vapor Detection Using Single-Walled Carbon Nanotubes," Chem. Soc. Rev., vol. 35, pp. 790-798, (2006).

M. Rowell; M. Topinka; M. McGehee; H. Prall; G. Dennler; N. Sariciftci; L. Hu and G. Gruner, "Organic Solar Cells With Carbon Nanotube Network Electrodes," Applied Physics Letters, vol. 88, 233506, (2006).

C. Kocabas; N. Pimparkar; O. Yesilyurt; S. Kang; M. Alam and J. Rogers, "Experimental and Theoretical Studies of Transport through Large Scale, Partially Aligned Arrays of Single-Walled Carbon Nanotubes in Thin Film Type Transitors," Nano Letters, vol. 7, No. 5, pp. 1195-1202, (2007).

* cited by examiner

SELECTIVE NANOTUBE FORMATION AND RELATED DEVICES

RELATED PATENT DOCUMENTS

This patent document is a divisional, under 35 U.S.C. §120 of U.S. patent application Ser. No. 12/492,829 filed on Jun. 26, 2009 (U.S. Pat. No. 8,237,155), which claims the benefit, under 35 U.S.C. §119(e), of U.S. Provisional Patent Application Ser. No. 61/133,789 filed on Jul. 2, 2008 and entitled "Selective Nanotube Formation and Related Devices;" each of these patent documents and the Appendices filed in the underlying provisional application are fully incorporated herein by reference.

FEDERALLY-SPONSORED RESEARCH OR DEVELOPMENT

This invention was made with Government support under contracts HM1582-07-1-2009 awarded by the National Geospatial—Intelligence Agency and 0213618 awarded by the National Science Foundation. The Government has certain rights in this invention.

BACKGROUND

Nanotubes exhibit electrical, mechanical and other properties that are desirable for a variety of applications. For instance, relative to other electronic materials, nanotubes exhibit ballistic electronic transport, can function as a semiconductor material, can be made entirely of carbon so that they are inert and do not degrade or react with local environments, and can be made from material that is highly abundant. In addition, nanotubes are robust and strong, often exhibiting an elastic modulus of about 1 TPa and a density of about 1.3 g/cm3 (e.g., relative to an elastic modulus of about 0.0012 TPa for steel, and a density of about 9 $g/cm^3$ for copper). These properties of nanotubes are desirable for use with a variety of applications, such as for flexible electronics, electronic paper, clothing or textiles, and robust sensors for weapons, chemical, and biological species detection.

While nanotubes exhibit promising applications, several challenges exist to their implementation. For instance, nanotubes come in several types, each having different electronic structures (chiralities). Nanotube fabrication approaches generally produce a mix of different types of nanotubes. As certain types are not desirable for a variety of applications, the presence of different types of nanotubes can be troublesome. In addition, it is often difficult to form nanotubes in a desirable arrangement.

These and other considerations remain challenging to the manufacture and implementation of nanotubes.

SUMMARY

Aspects of the present invention are directed to addressing challenges related to the manufacture and implementation of nanotubes, including those challenges described above. The present invention is exemplified in a number of implementations and applications, some of which are summarized below.

According to an example embodiment of the present invention, nanotubes are sorted by type using a treated substrate and mechanical (or other force-application) removal with selectivity to one of different types of nanotubes (e.g., to one of semiconducting-type and metallic-type nanotubes). The surface of the substrate is treated to respectively interact with different types of nanotubes at different substrate-nanotube interaction strengths. A nanotube solution is applied to the treated surface, and the solution (e.g., liquid or vapor phase) includes semiconducting-type nanotubes and metallic-type nanotubes dispersed in a solvent. For at least a portion of the substrate surface, a substantial portion of one of the types of nanotubes is removed, the one type of nanotubes exhibiting a substrate-nanotube interaction strength that is lower, relative to the substrate-nanotube interaction strength for the other one of the types of nanotubes. Using this approach, nanotubes such as individual nanotubes, nanotube films, nanotube sheets or nanotube networks are selectively sorted (manufactured or otherwise formed). In addition and in connection with certain embodiments, by controlling the forces and volume of nanotube solution involved, one or both of the density and alignment of nanotubes can be controlled.

According to another example embodiment, a nanotube film is spin-coated onto a substrate. An upper surface of the substrate is treated to respectively interact with semiconducting-type nanotubes and with metallic-type nanotubes at different substrate-nanotube interaction strengths. The substrate is spun to apply a shearing force that is sufficient to overcome the substrate-nanotube interaction of a first one of the types of nanotubes, and that is insufficient to overcome the substrate-nanotube interaction of the other one of the types of nanotubes. While the substrate is spinning, a nanotube solution including semiconducting-type nanotubes and metallic-type nanotubes is applied to the substrate surface, using the shearing force to remove a substantial portion of the first type of nanotubes.

According to another example embodiment, an electronic nanotube device is formed by treating a substrate surface to respectively interact with semiconducting-type nanotubes and with metallic-type nanotubes at different substrate-nanotube interaction strengths. A nanotube solution, including semiconducting-type nanotubes and metallic-type nanotubes dispersed in a solvent, is applied to the treated substrate. A substantial portion of one of the types of nanotubes is removed, the one type of nanotubes exhibiting a substrate-nanotube interaction strength that is lower, relative to the substrate-nanotube interaction strength for the other one of the types of nanotubes.

According to another example embodiment, a nanotube electronic device includes a treated substrate surface and a plurality of nanotubes. The treated surface respectively interacts with semiconducting-type nanotubes and with metallic-type nanotubes at different substrate-nanotube interaction strengths. The plurality of nanotubes is of a type of nanotubes for which substrate-nanotube interaction strength is higher, relative to substrate-nanotube interaction strength for the other one of the types of nanotubes.

According to another example embodiment, a semiconductor substrate is adapted for the manufacture of nanotubes. The substrate includes a treated surface that respectively interacts with semiconducting-type nanotubes and with metallic-type nanotubes at different substrate-nanotube interaction strengths.

According to another example embodiment, nanotubes are manufactured and separated using a treated substrate surface that respectively interacts with semiconducting-type nanotubes and with metallic-type nanotubes at different substrate-nanotube interaction strengths. The treated surface thus facilitates, in response to a force applied to nanotubes interacting with the substrate, the removal of a substantial portion of one of the types of nanotubes with which the substrate exhibits a lower interaction strength, relative to the other one of the types of nanotubes.

The above overview is not intended to describe each illustrated embodiment or every implementation of the present invention. The figures, description and claims also exemplify these embodiments.

BRIEF DESCRIPTION OF THE DRAWINGS

Aspects of the invention may be more completely understood in consideration of the detailed description of various embodiments of the invention in connection with the accompanying drawings, in which.

While the invention is amenable to various modifications and alternative forms, specifics thereof have been shown by way of example in the drawings and are described in detail. It should be understood, however, that the intention is not necessarily to limit the invention to the particular embodiments described. On the contrary, the intention is to cover all modifications, equivalents, and alternatives falling within the spirit and scope of the invention, including that defined by the claims.

DETAILED DESCRIPTION

The present invention is believed to be applicable to a variety of different methods, devices and other approaches involving different types (e.g., chiralities) of nanotubes, and has been found to be particularly useful for applications involving the selective retention or enrichment of one of the nanotube types and removal of another one of the nanotube types. While the present invention is not necessarily limited to such approaches, various aspects of the invention may be appreciated through a discussion of various examples using these and other contexts. Such discussion is made in the following, as well as in M. LeMieux, M. Roberts, S. Barman, Y. W. Jin, J. M. Kim, Z. Bao, "Self-sorted, Aligned Nanotube Networks for Thin-film Transistors," Science 321, pp. 101-103, 2008, which generally corresponds to Appendix A as part of the provisional application, to which priority is claimed above. Such discussion is also made in the aforesaid provisional application (which also includes Appendix B therein, entitled "Self-sorted SWNT networks for High on/off Ratio Thin Film Transistors"), which is also fully incorporated herein by reference.

In connection with various example embodiments, a substrate is treated to exhibit interaction selectivity to one of different types of nanotubes to be applied to the substrate, to set the type and/or density of nanotubes that is retained on the substrate. These different types may, for example, be respectively of the semiconducting-type or metallic-type nanotubes, with the following discussion directed to these different types by way of example. In some applications, the substrate is treated to exhibit relatively stronger interactions with semiconducting-type nanotubes. In other applications, the substrate is treated to exhibit relatively stronger interactions with metallic-type nanotubes. In still other applications, different portions of a substrate are treated to interact differently with semiconducting-type and metallic-type nanotubes to facilitate semiconducting-type nanotube formation in one portion, and metallic-type nanotube formation at another portion.

After the substrate has been treated, semiconducting-type and mechanical-type nanotubes are introduced to the substrate, and a force is applied to remove nanotubes exhibiting relatively lower substrate-interaction strength. For instance, where a substrate is treated to interact more strongly with semiconducting-type nanotubes than with metallic-type nanotubes, a mechanical force that is sufficient to remove a majority of the metallic-type nanotubes, but insufficient to remove a significant number of the semiconducting-type nanotubes, is applied to the nanotubes. With these approaches, substrate-nanotube interactions are used to control the selective formation of nanotubes of one or both of the semiconducting-type and metallic-type, and the control and formation can be carried out at room temperature.

In addition, these approaches are applicable for use with a variety of nanotubes, such as carbon nanotubes, variations of carbon nanotubes (e.g., with interstitial replacements), nanotubes having various metals, and combinations of different types of nanotubes. For instance, nanotubes exhibiting different chiralities can be sorted, where the chiralities may fall within a general classification of either semiconducting-type or metallic-type nanotubes, or exhibit certain properties relating to both semiconductors and metals. Different functional groups can be chosen and used for treating a substrate to interact differently with such different chiralities.

Nanotubes applicable for use in connection with a variety of example embodiments are synthesized using one or more of numerous techniques including, for example, arc-discharge, laser ablation, high-pressure CO conversion (HiPCo) and others. In addition, nanotubes of a variety of forms, diameters and lengths are used to suit different applications.

Generally, the removal (e.g., sorting, or manufacture) of one of two types of nanotubes is carried out so that a substantial portion of nanotubes remaining on the substrate (or on a target region of the substrate) are of a selected type. In these and other embodiments, a substantial portion may involve at least 70% of all nanotubes, at least 80% of all nanotubes, at least 90% of all nanotubes, or at least 95% of all nanotubes. That is, while the application of a mechanical force may not remove all weakly-interacted nanotubes from a substrate surface, the mechanical force predominantly removes the weakly-interacted nanotubes (e.g., at least 70%), leaving behind a combination of nanotubes that is dominated by more strongly-interacted nanotubes. This approach is applicable to use in removing different types of nanotubes that exhibit different interaction strengths with differently-functionalized substrate, as amenable to semiconducting-type versus metallic-type nanotubes, or to other different types of nanotubes (e.g., between two different types of metallic nanotubes).

Various embodiments are directed to methods for the selective manufacture of nanotubes and/or the manufacture of electronic devices using the nanotubes. Other embodiments are directed to electronic devices having treated substrates that facilitate the selective formation thereof. Still other embodiments are directed to substrates treated for the selective manufacture of nanotubes and/or for implementation with electronic devices.

The substrates are selected and further treated for selective interaction with nanotubes using one or more of a variety of approaches, such as by using different chemicals and/or treatment approaches. In one embodiment, a silicon substrate surface is cleaned to expose a layer of hydroxyl groups. Subsequent chemical reactions are carried out to replace the hydroxyl groups with a new layer of molecules that exhibits desirable nanotube interactions. In some instances, a chemical group exhibiting a relatively stronger interaction with semiconducting nanotubes (relative to metallic nanotubes)

such as an amine group is used to replace some or all of the hydroxyl groups. In other instances, a chemical group exhibiting a relatively stronger interaction with metallic nanotubes (relative to semiconducting nanotubes) is used to replace some or all of the hydroxyl groups. By selectively treating a substrate, nanotubes can be formed at selected locations, as well as at selected density and alignment (e.g., via treatment type, density and/or location), to form a variety of electronic devices.

The type of substrate that is used for treatment and nanotube formation is selected to suit various applications. In some embodiments, the substrate includes a dielectric material that exhibits both functionality (for further grafting of chemical groups) and high-performance (for high current flow in a nanotube network). Other substrates are selected for device implementation, such as for thin-film transistor sensors, displays or for solar panels. In some applications, a polymeric substrate is used, having functional groups built in the substrate (i.e., formed within the substrate), and/or having functional groups subsequently attached. In other applications, a metal with a functionalized/functionalizable polymer coating is used as the substrate. In certain applications, the substrate includes different materials in different locations, to facilitate nanotube-substrate interactions or for other reasons.

In still other instances, different chemical groups exhibiting different relative interaction strengths are respectively used to replace hydroxyl groups at different regions to facilitate the formation of different types of nanotubes at the respective regions, such as to form both semiconducting regions (e.g., for transistors) and metallic regions (e.g., for electrodes, interconnects and/or vias in semiconductor circuits, or transparent electrodes for large area displays and solar panels). For instance, some regions of an upper surface of a substrate can be patterned with amine and other regions can be patterned with at least one of: material that exhibits weak interactions with semiconducting nanotubes (e.g., a material such as $SiO_2$ or alkyl that does not strongly interact with carbon nanotubes); material that interacts more strongly with metallic nanotubes (such as phenyl); or a material that does not have selectivity in interaction relative to either semiconducting-type or metallic-type nanotubes.

A mechanical force is applied to remove nanotubes that exhibit lower interaction with the treated substrate, relative to other nanotubes that exhibit higher interactions with the substrate. In some embodiments, the mechanical force is applied during application of a nanotube solution to the substrate by spinning the substrate at a rotational speed that effects a shearing force upon the nanotubes. In connection with this approach, it has been discovered that the rotational speed can be set to apply a force that selectively removes nanotubes of a type that exhibits a relatively weak interaction with the treated substrate. In certain embodiments, rotational speed and/or other aspects of the rotation are set to align the nanotubes.

Other types of mechanical forces are applied to remove nanotubes in order to suit particular applications. For example, applying fluid pressure (e.g., an air jet), stirring of a nanotube solution as it is applied, application of a nanotube solution to a substrate using a high-velocity stream or jet, applying sonic or ultrasonic waves, or adhesion (e.g., tape) can be used to create a force to remove nanotubes. Generally, the force is sufficient to remove nanotubes exhibiting a relatively-lower interaction strength, and is insufficient to remove nanotubes exhibiting relatively higher interaction strength. In addition, the force can be applied during and/or after application of the nanotubes to the treated substrate.

In some embodiments, a spin-coating approach is used to apply a mechanical force in connection with the formation of nanotubes. A nanotube solution including both semiconducting and metallic nanotubes is spin-coated onto a substrate to enhance the hydrodynamic flow of the nanotube solution so that only specific chiralities of nanotubes are formed at the surface. The spin-coating applies a mechanical shear that removes nanotubes with which the substrate does not interact strongly (i.e., strongly enough to grab or hold on to nanotubes of a particular type, while allowing nanotubes of a different type to be removed by hydrodynamic flow). Remaining nanotubes are of a controlled type at regions of the substrate treated to respectively exhibit greater interaction with one of semiconducting-type or metallic-type nanotubes. In some applications, the spin-coating approach is implemented to form a monolayer of nanotubes on a treated surface, such that nanotubes remaining after spinning are in a monolayer (e.g., on the surface in a sub-monolayer density). In addition, the spin-coating approach can be carried out to set the alignment of nanotubes relative, for example, to hydrodynamic flow of nanotube solution.

Nanotubes formed in connection with the above embodiments are implemented using one or more of a variety of approaches. In some applications, a semiconductor substrate is treated to exhibit high interactions with semiconducting-type nanotubes, relative to interactions with metallic-type nanotubes. A solution of both semiconducting-type and metallic-type nanotubes is applied to the substrate, and the nanotubes are subjected to a mechanical force that is great enough to remove substantially all of the metallic-type nanotubes, leaving behind most of the semiconducting-type nanotubes. The remaining semiconducting nanotubes are used to form an active region of a semiconductor device such as a switch (e.g., to form a channel region of a thin-film transistor, such as described in the above-cited *Science* paper to LeMieux et al., with an on/off ratio of about 100,000 and carrier mobility of about 1-6 square centimeters per volt-second).

In some applications, the nanotube solution has few or no surfactants. For instance, an acetone wash may be used to completely remove, or reduce the percentage of surfactants (e.g., to below 10%, or to below 5%). In other applications, the nanotube solution has nanotubes that are wrapped in a surfactant/polymer that has selective interaction with a treated surface.

Figure 1A:
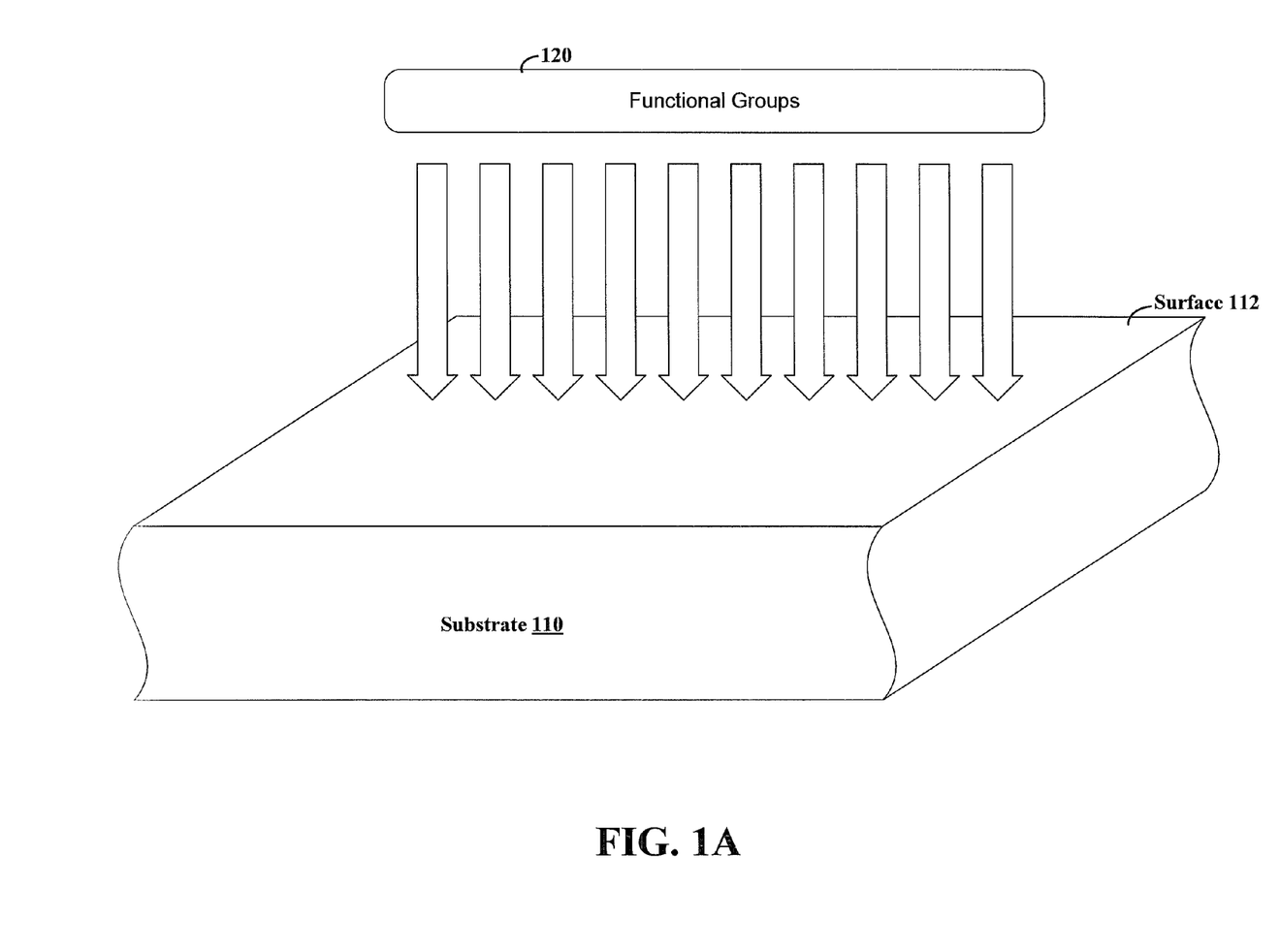
FIG. 1A-FIG. 1C show a substrate undergoing treatment and selective nanotube formation, according to an example embodiment of the present invention.
Figure 1B:
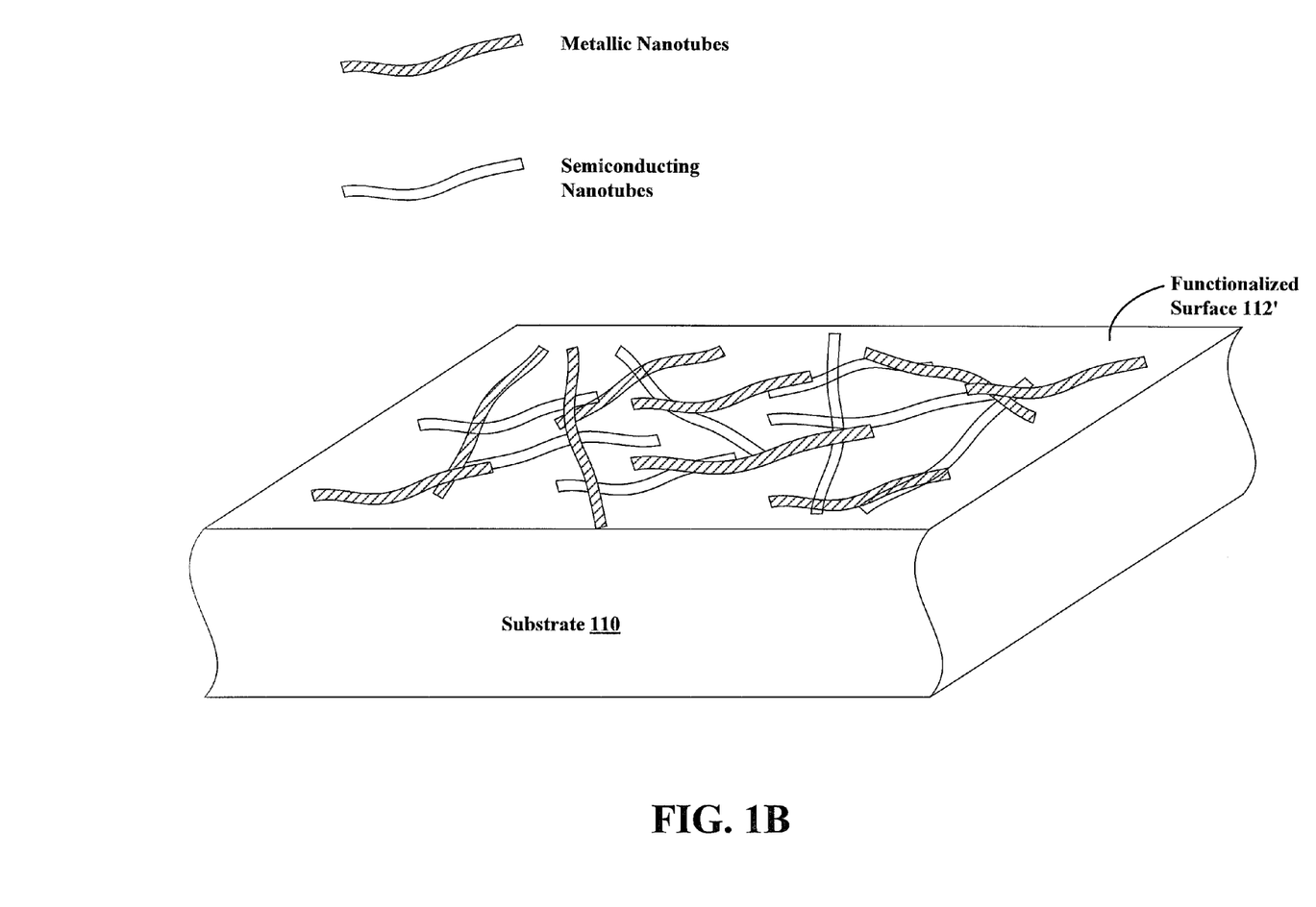
Figure 1C:
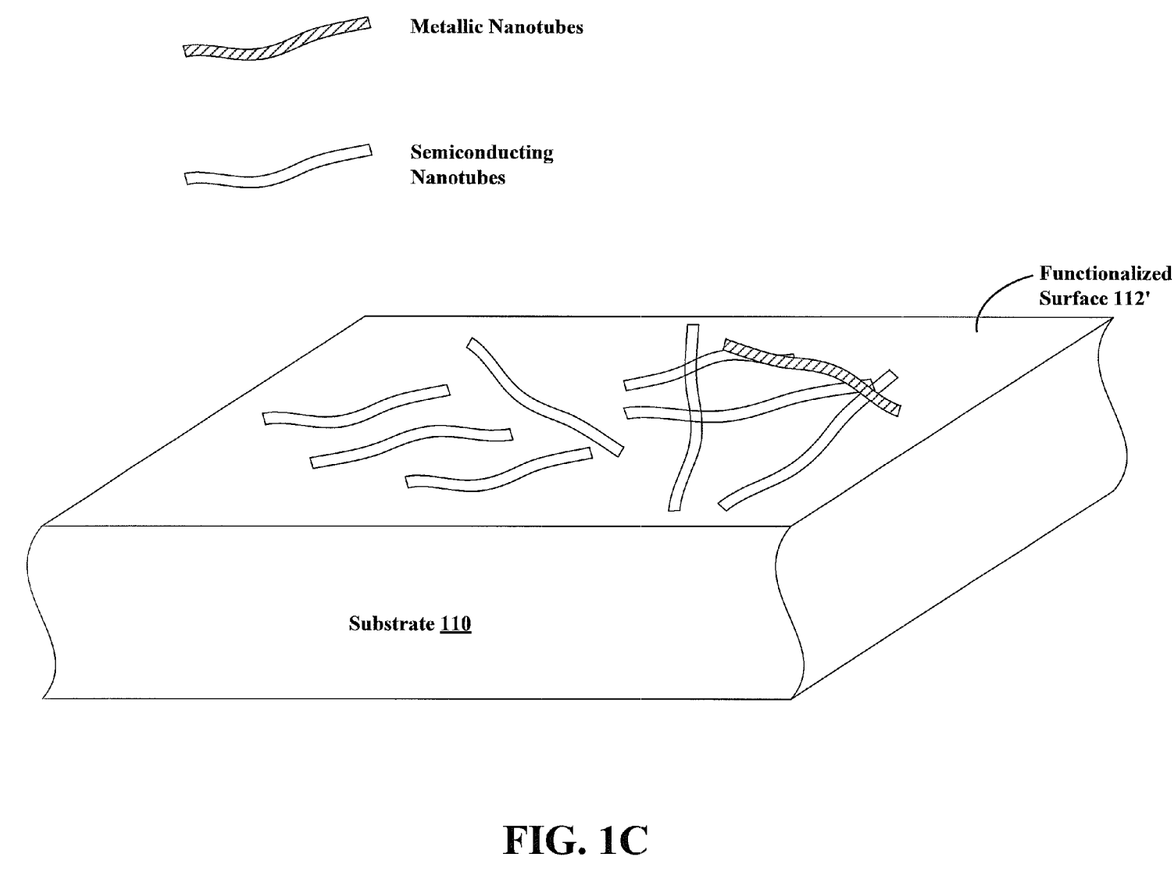

Turning now to the figures, FIG. 1A-FIG. 1C show a cross-sectional view of a portion of substrate 110 undergoing treatment and selective nanotube formation, according to another example embodiment of the present invention. Beginning with FIG. 1A, an upper surface 112 of the substrate 110 is treated with one or more different functional groups 120 to set the relative interaction strength of some or all of the surface with semiconducting-type and metallic-type nanotubes. At FIG. 1B, a solution of nanotubes including both semiconducting-type and metallic-type nanotubes are introduced to the functionalized surface 112'.

By way of example, FIG. 1C shows the substrate 110 as in FIG. 1B after application of a mechanical force, where the functionalization carried out at FIG. 1A sets the relative interaction strength of the shown portion of the substrate 110 to a higher value for semiconducting-type nanotubes, relative to the interaction strength with metallic-type nanotubes. Upon application of a mechanical force, the majority of the metallic-type nanotubes have been removed, leaving behind nanotubes that are substantially all of the semiconducting-type, using the relative substrate-nanotube interaction strengths to control the removal.

Figure 2:
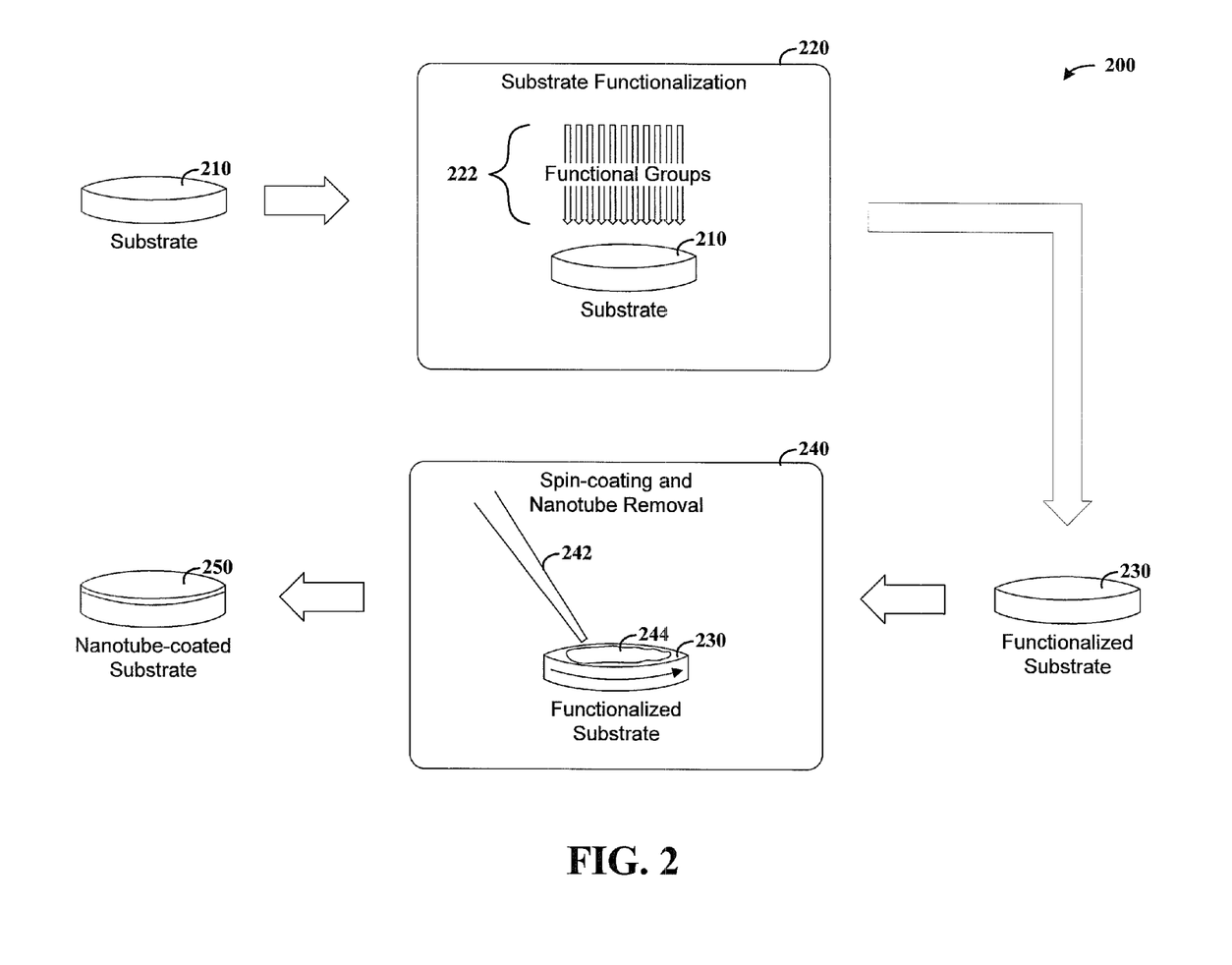
FIG. 2 shows an arrangement and approach for manufacturing nanotubes, according to another example embodiment of the present invention.

FIG. 2 shows an arrangement and approach 200 for manufacturing nanotubes, according to another example embodiment of the present invention. A substrate 210 is functionalized at 220 using one or more types of functional groups 222 to produce a functionalized substrate 230. The functionalized substrate 230 is then placed in a spin-coating arrangement 240, which spins the functionalized substrate during application of a nanotube solution 244 via a solution supply 242. The functionalized substrate 230 is spun at a rate that introduces sufficient force to remove nanotubes for which substrate-nanotube interactions are insufficient to withstand the mechanical forces applied via the spinning.

As consistent with the above description, the functionalization at 220 is carried out so that the functionalized substrate 230 exhibits strong interactions with either semiconducting-type or metallic-type nanotubes (or both types but at different locations), and weak interactions with the other of the types. This facilitates the removal of one of the semiconducting-type or metallic-type of nanotubes at 240, to form a nanotube-coated substrate 250. Accordingly, various embodiments are directed to the implementation of the arrangement shown in FIG. 2 in connection with one or more of the embodiments discussed above, some of which are also shown in FIGS. 1A-1C.

Figure 3:
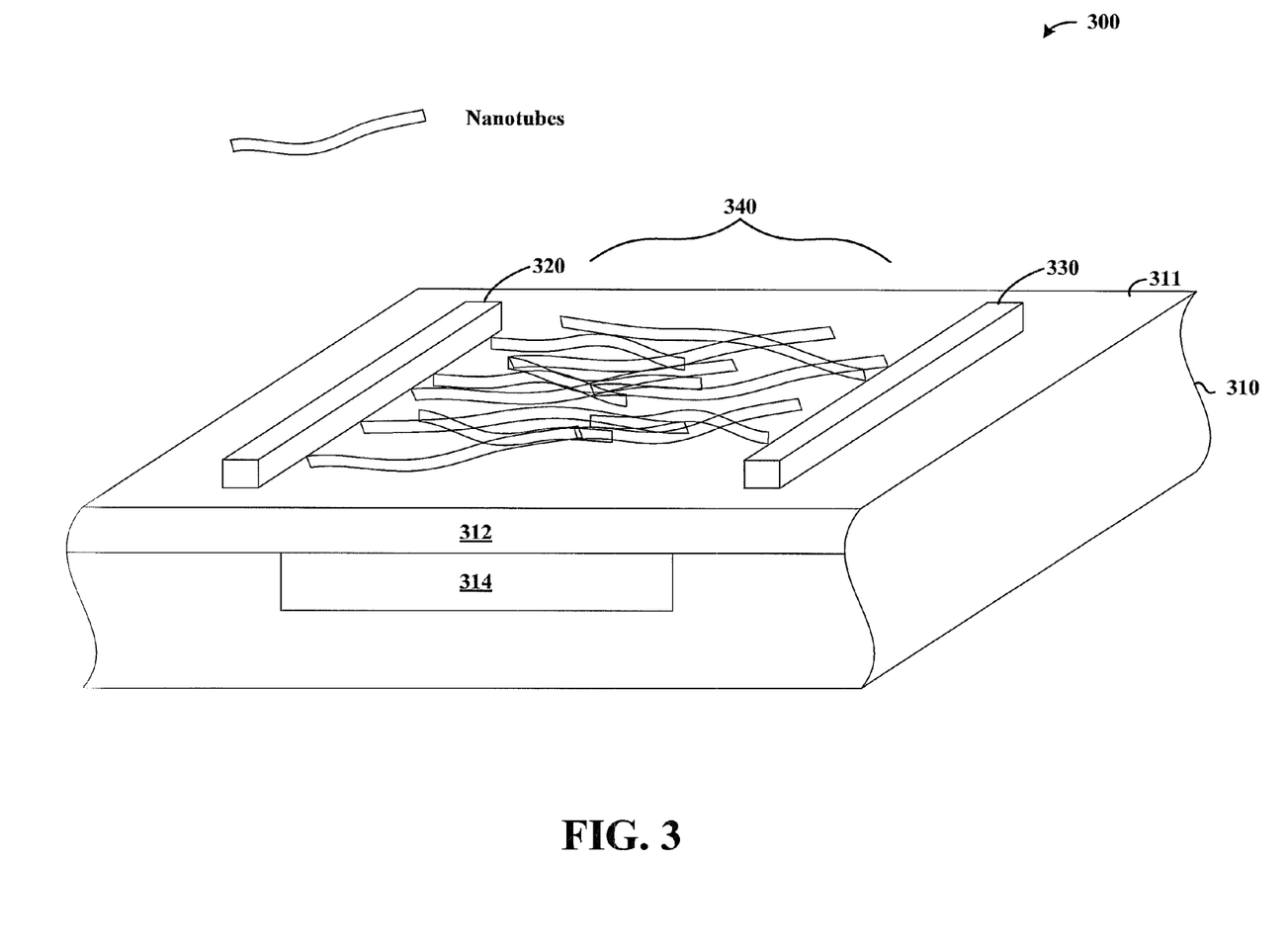
FIG. 3 shows a semiconductor device, according to another example embodiment of the present invention.

FIG. 3 shows a semiconductor device 300 having a functionalized substrate, according to another example embodiment of the present invention. The substrate 310 has an upper surface 311 that is functionalized to selectively interact with nanotubes of a semiconducting type, relative to nanotubes of a metallic type. Such an interaction may, for example, involve a chemical and/or electrical interaction between semiconducting nanotubes and the substrate, which tends to hold the nanotubes in proximity to the substrate in the presence of an external force. The substrate 310 also includes an insulating layer 312 and a back gate 314. Source and drain electrodes 320 and 330 are formed on the upper surface 311, and separated by a channel region 340 to which the back gate is capacitively coupled, via the insulating layer 312.

By way of example, the channel region 340 is shown including several semiconducting nanotubes, with which the substrate 310 is configured to interact. As discussed above, such an interaction serves to render the nanotubes capable of withstanding an applied force, such as a mechanical force. The nanotubes are further aligned to provide a semiconducting channel between the source and drain electrodes 320 and 330.

Various other embodiments are directed to structures similar to that shown in FIG. 3, with the source and drain electrodes within a substrate (e.g., with a bottom-contact layout) and/or with the gate located over the source and drain electrodes. For example, certain embodiments are directed to an integrated circuit device, such as a thin-film transistor device, that employs a plurality or multitude of devices similar to the device 300 in FIG. 3 which are integrated on a common substrate.

Experimental Embodiments

The following discussion characterizes several example experimental embodiments, some of which may be implemented in connection with one or more of the embodiments described herein.

Preparation of Surfaces

Heavily doped Silicon wafers (Silicon Quest) of (100) orientation with an oxide are cleaned in hot Piranha solution (3:1 $H_2SO_4:H_2O_2$), rinsed copiously with water, dried under $N_2$, and taken inside a dry $N_2$ glovebox for silane modification. Self assembled monolayers (SAMs) of aminopropyltriethoxy silane and (APTES) phenyltriethoxy silane (PTEOS) (Gelest, silanes distilled prior to use) are absorbed from 1% solution in anhydrous toluene (AHT) for 1 h and 6 h, respectively, at room temperature. Following self-assembly, surfaces are rinsed twice in AHT, sonicated in AHT, and rinsed again in AHT, then dried under $N_2$, and characterized by contact angle, atomic force microscopy (not sure if this is necessary) and ellipsometry. Thin film transistor (TFT) geometry is either bottom contact (conventional lithography, 40 nm thick gold electrodes) with channel lengths of 2 μm, 5 μm, 10 μm, and 15 μm, or top contact (40 nm gold deposited through a shadow mask), with channel length of 30 μm, and channel width 50 μm and 500 μm, respectively.

Purification of SWNTs

Generally, 80 mg arc-discharge single walled nanotubes (AD-SWNTs) (e.g., from ILJIN Nanotech), Grade ASP-100F and 2 g of sodium dodecyl sulfate (SDS) (e.g., from J. T. Baker) are mixed with 200 ml Ultrapure water (0.1micro filtered (e.g., from Invitrogen)). The mixture is sonicated in a cup-horn sonicator (e.g., a Cole-Parmer Ultrasonic Processor) 750 W, (100% amplitude) for 30 min with ice-water bath. The sonicated mixture is centrifuged (e.g., in a Sorvall RC5C Plus) at 12,500 RPM for 4 h at 4° C. The supernatant (~80%) is carefully decanted, which contains single tubes and small bundles. After diluting the supernatant with anhydrous acetone, the surfactant (SDS) is dissociated from SWNTs and the flocculated SWNTs are collected by centrifugation. Upon washing the flocculated SWNTs with acetone several times to completely remove the surfactant, the suspension is filtered through PTFE membrane (Millipore, 0.45 μm pore size) to collect the nanotubes. The as-formed "bucky paper" is peeled off from the membrane and dried under vacuum at 50° C. overnight.

Nanotube Solution Preparation

Solutions of the purified bucky paper and solvents are prepared by sonication at 600W, (70% amplitude) at a concentration of 10 μg/ml in NMP (1-methyl-2-pyrrolidone, Omnisolve, Spectrophotometry grade) for 1 hour. This concentration in NMP is well below the solubility limit, which is around 25-30 μg/mL, to ensure completely de-bundled, isolated SWNTs in solution.

Spincoating Procedure

An example spin assembly process involves depositing the solution onto a spinning substrate (e.g., relative to dispensing the solution followed by spinning the substrate). These solutions (roughly 150 μL) are dropped via pipette near the surface and in the center of a 2.5 cm×1.5 cm of the modified silicon wafer spinning at speeds between 1000-4000 RPM (e.g., from Headway Research). Alternatively, for comparison the solution is dropped and the wafer is then subsequently spun (after 5-300 seconds wait time). The samples are then dried in a vacuum oven (50° C.) for approximately 1.5 hours to remove residual solvent, and stored under vacuum until analysis.

Sample Characterization

Atomic force microscopy (AFM) topography images are acquired in the tapping mode regime using a Multimode AFM (e.g., from Veeco). Electronic tests are conducted using a Keithley 4200 SC semiconductor analyzer. Transfer plots are averaged from at least eighty measurements over twelve separate wafers for each surface functionalization. Micro-Raman (LabRam Aramis, Horiba Jobin Yvon) measurements are carried out at 633 nm (1.96 eV) and 785 (1.58 eV) excitation at 100× magnification and 1 um spot size, and 1800 grating. Excitation power is 5 mW for the 633 nm line and 25 mW for the 785 nm line. Data is acquired from automated multi-point (e.g., using 12 points) mapping over random areas (at least five different areas, excluding the extreme 2 mm diameter center of the wafer) of each wafer, with three spectra accumulated and averaged at each of these mapped points. Overall, summarized data are derived from this mapping procedure on at least twelve different wafers for each surface. All summarized data is normalized to the 303 $cm^{-1}$ mode in silicon.

While certain aspects of the present invention have been described with reference to several particular example embodiments, those skilled in the art will recognize that many changes may be made thereto without departing from the spirit and scope of the present invention. For example, many of the embodiments described in the above-cited *Science* paper to LeMieux et al. as well as the references cited therein, and in the above-referenced Provisional Patent Application to which priority is claimed, may be implemented in connection with and/or augment the embodiments described above, as well as those described in the claims. In addition, various types of nanotubes may be selectively maintained or removed, in addition to those described types (e.g., semiconducting and metallic nanotubes), with the treated substrate provided to interact at different strengths with different types of nanotubes. Aspects of the invention are set forth in the following claims.

What is claimed is:

1. A method for manufacturing nanotubes, the method comprising:
   treating a substrate surface to respectively interact with semiconducting-type nanotubes and metallic-type nanotubes at different substrate-nanotube interaction strengths;
   applying, to the treated surface, a nanotube solution including semiconducting-type nanotubes and metallic-type nanotubes dispersed in a solvent; and
   for at least a portion of the substrate surface, mechanically removing a substantial portion of one of the types of nanotubes for which the substrate-nanotube interaction strength is lower, relative to the substrate-nanotube interaction strength for another one of the types of nanotubes;
   wherein treating a substrate surface includes
      selectively functionalizing semiconductor regions of the surface to exhibit higher chemical interaction with semiconducting nanotubes, relative to interaction with metallic nanotubes, and
      selectively functionalizing conductor regions of the surface to exhibit higher chemical interaction with metallic nanotubes, relative to interaction with semiconducting nanotubes, and
   wherein the step of mechanically removing includes removing metallic-type nanotubes from the semiconductor regions and removing semiconducting-type nanotubes from the conductor regions.

2. The method of claim 1, wherein the step of mechanically removing includes applying a mechanical force that is sufficient to remove the substantial portion of said one of the types of nanotubes, and while being insufficient to remove a significant number of the said other one of the types of nanotubes.

3. The method of claim 1, wherein
   the step of applying includes spinning the substrate prior to and during the application of the nanotube solution to the treated surface, and
   the step of mechanically removing includes spinning the substrate to apply mechanical shear to said one of the types of nanotubes.

4. The method of claim 1, wherein the step of mechanically removing includes spinning the substrate to apply a mechanical shearing force that is sufficient to remove the substantial portion of said one of the types of nanotubes, and while being insufficient to remove a significant number of the said other one of the types of nanotubes.

5. The method of claim 1, wherein treating a substrate surface includes functionalizing the surface with a chemical group to set characteristics of a subsequently-applied nanotube film, the characteristics including at least one of alignment, density, chirality and connectivity of the nanotubes in the film.

6. A method for manufacturing nanotubes, the method comprising:
   treating a substrate surface to respectively interact with semiconducting-type nanotubes and metallic-type nanotubes at different substrate-nanotube interaction strengths;
   applying, to the treated surface, a nanotube solution including semiconducting-type nanotubes and metallic-type nanotubes dispersed in a solvent; and
   for at least a portion of the substrate surface, mechanically removing a substantial portion of one of the types of nanotubes for which the substrate-nanotube interaction strength is lower, relative to the substrate-nanotube interaction strength for another one of the types of nanotubes;
   wherein treating a substrate surface includes
      selectively functionalizing semiconductor regions of the surface to exhibit higher chemical interaction with semiconducting nanotubes, relative to interaction with metallic nanotubes, and
      selectively functionalizing conductor regions of the surface to exhibit higher chemical interaction with metallic nanotubes, relative to interaction with semiconducting nanotubes,
   wherein the step of mechanically removing includes removing metallic-type nanotubes from the semiconductor regions and removing semiconducting-type nanotubes from the conductor regions; and
   wherein the step of applying includes spinning the substrate surface, while applying the nanotube solution thereto, at a rotational speed that sets a selected alignment of nanotubes in the solution.

7. The method of claim 1, wherein the step of applying includes forming a monolayer film of nanotubes.

8. The method of claim 1, wherein
   the step of applying includes coating the surface of the substrate with a layer of the nanotube solution, and
   the step of mechanically removing includes mechanically removing the substantial portion of one of the types of nanotubes after the surface has been coated.

9. The method of claim 1, wherein the step of treating a substrate surface includes
   selecting one of either semiconducting-type or metallic-type nanotubes according to an intended use of the substrate, and
   treating the substrate surface to interact more strongly with the selected one of the types nanotubes, relative to the other one of the types of nanotubes.

10. The method of claim 1, wherein applying a nanotube solution includes applying nanotubes dispersed in a solution that is substantially devoid of surfactants.

11. The method of claim 1, wherein applying a nanotube solution includes applying nanotubes dispersed in a solution that facilitates nanotube interaction directly with the treated substrate surface.

12. The method of claim 1, wherein the step of mechanically removing includes applying a linear shear force to remove a substantial portion of the one of the types of nanotubes.

13. A method for manufacturing involving spin-coating a nanotube film onto a substrate, the method comprising:
 treating an upper surface of the substrate to respectively interact with semiconducting-type nanotubes and with metallic-type nanotubes at different substrate-nanotube interaction strengths;
 spinning the substrate to apply a shearing force that is sufficient to overcome the substrate-nanotube interaction of a first one of the types of nanotubes, and that is insufficient to overcome the substrate-nanotube interaction of the other one of the types of nanotubes; and
 while the substrate is spinning,
  applying, to the treated surface, a nanotube solution including semiconducting-type nanotubes and metallic-type nanotubes, and
  using the shearing force to remove a substantial portion of the first type of nanotubes.

14. The method of claim 13, wherein using the shearing force to remove a substantial portion of the first type of nanotubes includes removing at least about 80% of the one of the types of nanotubes.

15. The method of claim 13, wherein treating an upper surface of the substrate includes forming a surface having at least some regions patterned with a material that interact strongly with semiconducting nanotubes and other regions patterned with at least one of: a material that exhibits weak interactions with semiconducting nanotubes, a material that interacts more strongly with metallic nanotubes relative to interactions with semiconducting nanotubes, and a material that does not exhibit relative selectivity to semiconducting or metallic nanotubes.

16. A method for manufacturing, comprising:
 providing a treated substrate surface; using the treated substrate surface that respectively interacts with semiconducting-type nanotubes and with metallic-type nanotubes at different substrate-nanotube interaction strengths to separate, by mechanically removing, the semiconducting-type nanotubes from the metallic-type nanotubes dispersed in a solvent and wherein the treated substrate surface includes selectively functionalized semiconductor regions to exhibit higher chemical interaction with the semiconducting nanotubes, relative to interaction with the metallic nanotubes, and selectively functionalized conductor regions to exhibit higher chemical interaction with metallic nanotubes, relative to interaction with semiconducting nanotubes;
 providing the semiconducting-type nanotubes separated from the metallic-type nanotubes.

17. The method of claim 16, further including mechanically removing a substantial portion of one of the types of nanotubes for which the substrate-nanotube interaction strength is lower, relative to the substrate-nanotube interaction strength for the other one of the types of nanotubes.

18. A method for manufacturing, comprising:
 treating a substrate surface to respectively interact with different nanotube types at different substrate-nanotube interaction strengths;
 applying, to the treated surface, a nanotube solution including different types of nanotubes dispersed in a solvent, the different types of nanotubes including metallic-type nanotubes and semiconducting-type nanotubes; and
 for at least a portion of the substrate surface, mechanically removing a substantial portion that is at least 70% of one of the types of applied nanotubes for which the substrate-nanotube interaction strength is lower, relative to the substrate-nanotube interaction strength for another one of the types of applied nanotubes, wherein the step of mechanically removing includes removing metallic-type nanotubes from semiconductor regions and removing semiconducting-type nanotubes from conductor regions, and wherein the treated substrate surface includes selectively functionalized semiconductor regions to exhibit higher chemical interaction with semiconducting nanotubes, relative to interaction with metallic nanotubes, and selectively functionalized conductor regions to exhibit higher chemical interaction with metallic nanotubes, relative to interaction with semiconducting nanotubes.

19. The method of claim 18, wherein treating a substrate surface includes functionalizing the surface with a chemical group to set characteristics of a subsequently-applied nanotube film, the characteristics including at least one of alignment and density of the nanotubes in the film.

* * * * *